(12) United States Patent
Marson et al.

(10) Patent No.: US 7,642,527 B2
(45) Date of Patent: Jan. 5, 2010

(54) MULTI-ATTRIBUTE LIGHT EFFECTS FOR USE IN CURING AND OTHER APPLICATIONS INVOLVING PHOTOREACTIONS AND PROCESSING

(75) Inventors: Jon Marson, Hillsboro, OR (US); Alex Schreiner, Hillsboro, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 194 days.

(21) Appl. No.: 11/614,753

(22) Filed: Dec. 21, 2006

(65) Prior Publication Data

US 2007/0154823 A1    Jul. 5, 2007

Related U.S. Application Data

(60) Provisional application No. 60/755,331, filed on Dec. 30, 2005.

(51) Int. Cl.
*G21K 5/00*   (2006.01)

(52) U.S. Cl. .............. 250/492.1; 250/493.1; 250/494.1; 250/504 R

(58) Field of Classification Search ............ 250/504 R, 250/503.1, 493.1, 494.1, 492.1, 495.1; 430/29, 430/5, 30; 264/494, 455, 458, 459, 480, 264/481, 405, 479, 492, 493; 607/1; 257/88, 257/89; 362/22, 230, 231, 234, 249.02, 253
See application file for complete search history.

(56) References Cited

U.S. PATENT DOCUMENTS

| | | | |
|---|---|---|---|
| 3,586,959 A | 6/1971 | Eccles et al. | |
| 3,936,686 A | 2/1976 | Moore | |
| 3,983,039 A | 9/1976 | Eastland | |
| 4,011,575 A | 3/1977 | Groves | |
| 4,118,873 A | 10/1978 | Rothchild | |
| 4,435,732 A | 3/1984 | Hyatt | |
| 4,530,040 A | 7/1985 | Petterson | |
| 4,544,642 A | 10/1985 | Maeda et al. | |
| 4,595,289 A | 6/1986 | Feldman et al. | |
| 4,684,801 A | 8/1987 | Carroll et al. | |
| 4,685,139 A | 8/1987 | Masuda et al. | |
| 4,734,714 A | 3/1988 | Takasu et al. | |
| 5,003,357 A | 3/1991 | Kim et al. | |

(Continued)

FOREIGN PATENT DOCUMENTS

DE    8815418    2/1989

(Continued)

OTHER PUBLICATIONS

PCT International Search Report dated Nov. 19, 2003 and International Preliminary Examination Report dated Sep. 29, 2003 for International PCT Application No. PCT/US03/14625, filed May 8, 2003, 6 pages.

(Continued)

*Primary Examiner*—Nikita Wells
*Assistant Examiner*—Nicole Ippolito Rausch
(74) *Attorney, Agent, or Firm*—Marger Johnson & McCollom, P.C.

(57) ABSTRACT

Systems and methods that provide multi-attribute light effects, including one or more channels for each light effect, preferably both channels being provided in an array of solid state light emitters.

9 Claims, 10 Drawing Sheets

U.S. PATENT DOCUMENTS

| | | | |
|---|---|---|---|
| 5,018,853 A | 5/1991 | Hechel et al. | |
| 5,195,102 A | 3/1993 | McLean et al. | |
| 5,278,432 A | 1/1994 | Ignatius et al. | |
| 5,296,724 A | 3/1994 | Ogata et al. | |
| 5,397,867 A | 3/1995 | Demeo | |
| 5,418,384 A | 5/1995 | Yamana et al. | |
| 5,420,768 A | 5/1995 | Kennedy | |
| 5,424,544 A | 6/1995 | Shelton et al. | |
| 5,436,710 A | 7/1995 | Uchiyama | |
| 5,490,049 A | 2/1996 | Montalan et al. | |
| 5,522,225 A | 6/1996 | Eskandari | |
| 5,554,849 A | 9/1996 | Gates | |
| 5,555,038 A | 9/1996 | Conway | |
| 5,623,510 A | 4/1997 | Hamilton et al. | |
| 5,632,551 A | 5/1997 | Roney et al. | |
| 5,660,461 A | 8/1997 | Ignatius et al. | |
| 5,698,866 A | 12/1997 | Doiron et al. | |
| 5,715,270 A | 2/1998 | Zediker et al. | |
| 5,806,965 A | 9/1998 | Deese | |
| 5,857,767 A | 1/1999 | Hochstein | |
| 5,877,899 A | 3/1999 | Stern et al. | |
| 5,880,828 A | 3/1999 | Nakamura et al. | |
| 5,892,579 A | 4/1999 | Elyasaf et al. | |
| 5,910,706 A | 6/1999 | Stevens et al. | |
| 6,033,087 A | 3/2000 | Shozo et al. | |
| 6,058,012 A | 5/2000 | Cooper et al. | |
| 6,088,185 A | 7/2000 | Ratliff et al. | |
| 6,118,383 A | 9/2000 | Hegyi | |
| 6,141,040 A | 10/2000 | Toh | |
| 6,150,774 A * | 11/2000 | Mueller et al. | 315/291 |
| 6,155,699 A | 12/2000 | Miller et al. | |
| 6,163,036 A | 12/2000 | Taninaka et al. | |
| 6,200,134 B1 | 3/2001 | Kovac et al. | |
| 6,273,596 B1 | 8/2001 | Parkyn, Jr. | |
| 6,291,839 B1 | 9/2001 | Lester | |
| 6,318,886 B1 | 11/2001 | Stopa et al. | |
| 6,319,425 B1 | 11/2001 | Tasaki et al. | |
| 6,325,981 B1 * | 12/2001 | Schuepbach et al. | 422/186.3 |
| 6,328,456 B1 | 12/2001 | Mize | |
| 6,366,017 B1 | 4/2002 | Antoniadis et al. | |
| 6,367,950 B1 | 4/2002 | Yamada et al. | |
| 6,373,635 B1 | 4/2002 | Fujimoto et al. | |
| 6,375,340 B1 | 4/2002 | Biebl et al. | |
| 6,419,384 B1 | 7/2002 | Lewis et al. | |
| 6,420,199 B1 | 7/2002 | Coman et al. | |
| 6,498,355 B1 | 12/2002 | Harrah et al. | |
| 6,525,335 B1 | 2/2003 | Krames et al. | |
| 6,534,791 B1 | 3/2003 | Hayashi et al. | |
| 6,536,889 B1 | 3/2003 | Biegelsen et al. | |
| 6,536,923 B1 | 3/2003 | Merz | |
| 6,547,249 B2 | 4/2003 | Collins, III et al. | |
| 6,554,451 B1 | 4/2003 | Keuper | |
| 6,561,640 B1 | 5/2003 | Young | |
| 6,561,808 B2 | 5/2003 | Neuberger | |
| 6,573,536 B1 | 6/2003 | Dry | |
| 6,577,332 B2 | 6/2003 | Osawa et al. | |
| 6,578,986 B2 | 6/2003 | Swaris et al. | |
| 6,578,989 B2 | 6/2003 | Osumi et al. | |
| 6,607,286 B2 | 8/2003 | West et al. | |
| 6,630,689 B2 | 10/2003 | Bhat et al. | |
| 6,683,421 B1 | 1/2004 | Kennedy et al. | |
| 6,686,581 B2 | 2/2004 | Verhoeckx et al. | |
| 6,708,501 B1 | 3/2004 | Ghoshal et al. | |
| 6,724,473 B2 | 4/2004 | Leong et al. | |
| 6,796,698 B2 | 9/2004 | Sommers et al. | |
| 6,800,500 B2 | 10/2004 | Coman et al. | |
| 6,815,724 B2 | 11/2004 | Dry | |
| 6,822,991 B2 | 11/2004 | Collins, III et al. | |
| 6,831,303 B2 | 12/2004 | Dry | |
| 6,857,767 B2 | 2/2005 | Matsui et al. | |
| 6,869,635 B2 | 3/2005 | Kobayashi | |
| 6,937,754 B1 | 8/2005 | Eguchi | |
| 6,967,342 B2 * | 11/2005 | Ruckman et al. | 250/504 R |
| 6,992,335 B2 | 1/2006 | Ohkawa | |
| 6,995,348 B2 | 2/2006 | Bradley et al. | |
| 7,009,165 B2 | 3/2006 | Hehemann et al. | |
| 7,071,493 B2 | 7/2006 | Owen et al. | |
| 7,102,172 B2 | 9/2006 | Lynch et al. | |
| 7,179,670 B2 | 2/2007 | Shelton et al. | |
| 7,189,983 B2 * | 3/2007 | Aguirre et al. | 250/504 R |
| 2001/0002120 A1 | 5/2001 | Bessendorf et al. | |
| 2001/0030782 A1 | 10/2001 | Trezza | |
| 2001/0046652 A1 | 11/2001 | Ostler et al. | |
| 2002/0016378 A1 | 2/2002 | Jin et al. | |
| 2002/0187454 A1 | 12/2002 | Melikechi et al. | |
| 2003/0015667 A1 * | 1/2003 | MacDougald et al. | 250/455.11 |
| 2003/0038943 A1 | 2/2003 | Almarzouk et al. | |
| 2003/0230765 A1 | 12/2003 | Dry | |
| 2004/0000677 A1 | 1/2004 | Dry | |
| 2004/0011457 A1 | 1/2004 | Kobayashi et al. | |
| 2004/0026721 A1 | 2/2004 | Dry | |
| 2004/0041521 A1 | 3/2004 | Mandler et al. | |
| 2004/0057873 A1 | 3/2004 | Yerazunis et al. | |
| 2004/0090794 A1 | 5/2004 | Ollette et al. | |
| 2004/0113549 A1 | 6/2004 | Roberts et al. | |
| 2004/0119084 A1 | 6/2004 | Hsieh et al. | |
| 2004/0134603 A1 | 7/2004 | Kobayashi et al. | |
| 2004/0135159 A1 | 7/2004 | Siegel | |
| 2004/0141326 A1 | 7/2004 | Dry | |
| 2004/0164325 A1 | 8/2004 | Siegel | |
| 2004/0166249 A1 | 8/2004 | Siegel | |
| 2004/0206970 A1 | 10/2004 | Martin | |
| 2004/0238111 A1 | 12/2004 | Siegel | |
| 2005/0087750 A1 | 4/2005 | Braddell et al. | |
| 2005/0098299 A1 | 5/2005 | Goodson et al. | |
| 2005/0104946 A1 | 5/2005 | Siegel | |
| 2005/0152146 A1 | 7/2005 | Owen | |
| 2005/0218468 A1 | 10/2005 | Owen | |
| 2005/0230600 A1 | 10/2005 | Olson et al. | |
| 2005/0231713 A1 | 10/2005 | Owen et al. | |
| 2005/0253252 A1 | 11/2005 | Owen et al. | |
| 2005/0285129 A1 | 12/2005 | Jackson, III et al. | |
| 2006/0161226 A1 * | 7/2006 | McMickle | 607/88 |
| 2006/0216865 A1 | 9/2006 | Owen et al. | |
| 2006/0269897 A1 * | 11/2006 | Gill et al. | 433/29 |
| 2007/0030678 A1 | 2/2007 | Bedson et al. | |
| 2007/0051964 A1 | 3/2007 | Owen et al. | |
| 2007/0109790 A1 | 5/2007 | Anderson et al. | |
| 2007/0154823 A1 | 7/2007 | Marson et al. | |
| 2007/0278504 A1 | 12/2007 | Jasmin et al. | |
| 2008/0254371 A1 * | 10/2008 | Ivanova et al. | 430/2 |

FOREIGN PATENT DOCUMENTS

| | | |
|---|---|---|
| EP | 0935145 | 8/1999 |
| EP | 1158761 | 11/2001 |
| EP | 1467416 | 10/2004 |
| EP | 1469529 | 10/2004 |
| GB | 2224374 | 8/1988 |
| GB | 2350321 | 11/2000 |
| GB | 2396331 | 6/2004 |
| GB | 2399162 | 9/2004 |
| JP | 404204333 | 11/1990 |
| JP | 2003268042 | 9/2003 |
| JP | 2005219400 | 8/2005 |
| WO | WO9716679 | 5/1997 |
| WO | WO9854227 | 12/1998 |
| WO | WO0037904 | 6/2000 |
| WO | WO0102846 | 1/2001 |
| WO | WO0206723 | 1/2002 |
| WO | WO0213231 | 2/2002 |
| WO | WO0226270 | 4/2002 |
| WO | WO2004009318 | 1/2004 |
| WO | WO2004011848 A2 | 2/2004 |

| WO | WO2004038759 | | 6/2004 |
| WO | WO2004056581 | A1 | 7/2004 |
| WO | WO2004078477 | | 9/2004 |
| WO | WO2004081475 | A2 | 9/2004 |
| WO | WO2005043598 | A2 | 5/2005 |
| WO | WO2005/116089 | | 12/2005 |
| WO | WO2006072071 | A2 | 7/2006 |

OTHER PUBLICATIONS

PCT International Search Report and Written Opinion dated Aug. 26, 2005 for International PCT Application No. PCT/US05/09407, filed Mar. 18, 2005, 11 pages.

PCT International Search Report and Written Opinion dated Jun. 17, 2005 for International PCT Application No. PCT/USO4/36370, filed Nov. 1, 2004, 6 pages.

PCT International Search Report and Written Opinion dated Oct. 13, 2006 for International PCT Application No. PCT/US05/13448, filed Apr. 19, 2005, 8 pages.

PCT International Search Report and Written Opinion dated Sep. 28, 2006 for International PCT Application No. PCT/US05/11216, filed Mar. 30, 2005, 9 pages.

PCT International Search Report and Written Opinion dated Oct. 16, 2006 for International PCT Application No. PCT/US05/09076, filed Mar. 18, 2005, 10 pages.

PCT International Search Report and Written Opinion dated Feb. 6, 2007 for International PCT Application No. PCT/US05/12608, Apr. 12, 2005, 9 pages.

PCT International Search Report and Written Opinion dated Feb. 27, 2008 for International PCT Application No. PCT/US05/47605, Dec. 30, 2005, 9 pages.

PCT International Search Report and Written Opinion dated Jun. 3, 2005 for International PCT Application No. PCT/US04/36260, Oct. 28, 2004, 9 pages.

Meskan, Dr. David A.; "Developments in Inerting Systems for Electron Beam Processors," Presented at Rad Tech/91 Europe; Edinburgh, Scotland; Sep. 29-Oct. 2, 1991; RPC Industries, 21325Cabot Blvd. Hayward, CA 94545.

PCT International Search Report and Written Opinion dated Jun. 7, 2006 for International PCT Application No. PCT/US04/36046, Oct. 29, 2004, 6 pages.

Supplemental European Search Report and Written Opinion for corresponding EU application No. EP03724539, dated Nov. 21, 2007, 8 pages total.

* cited by examiner

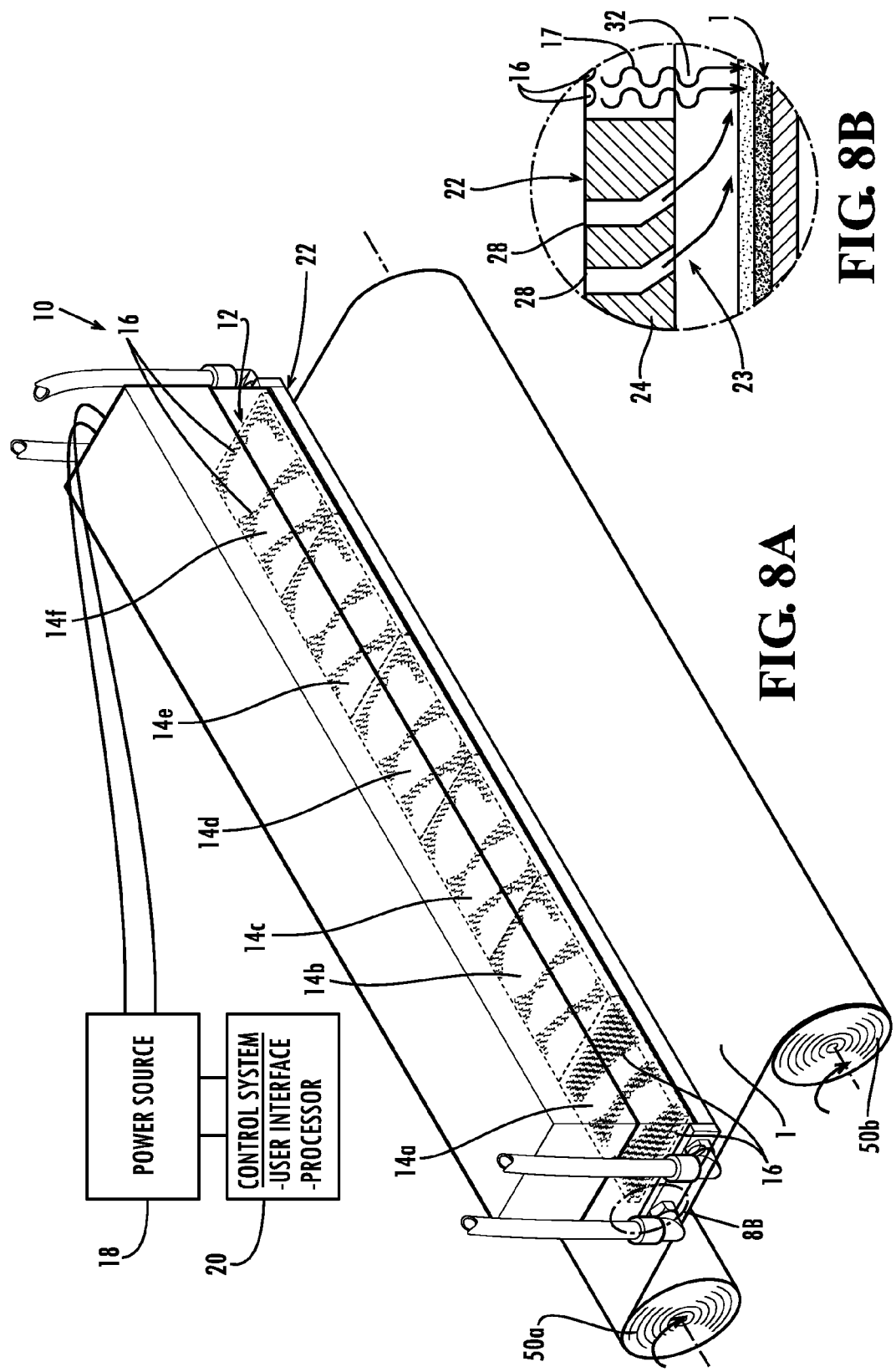

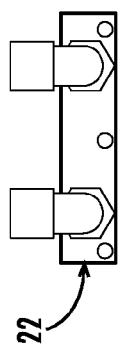
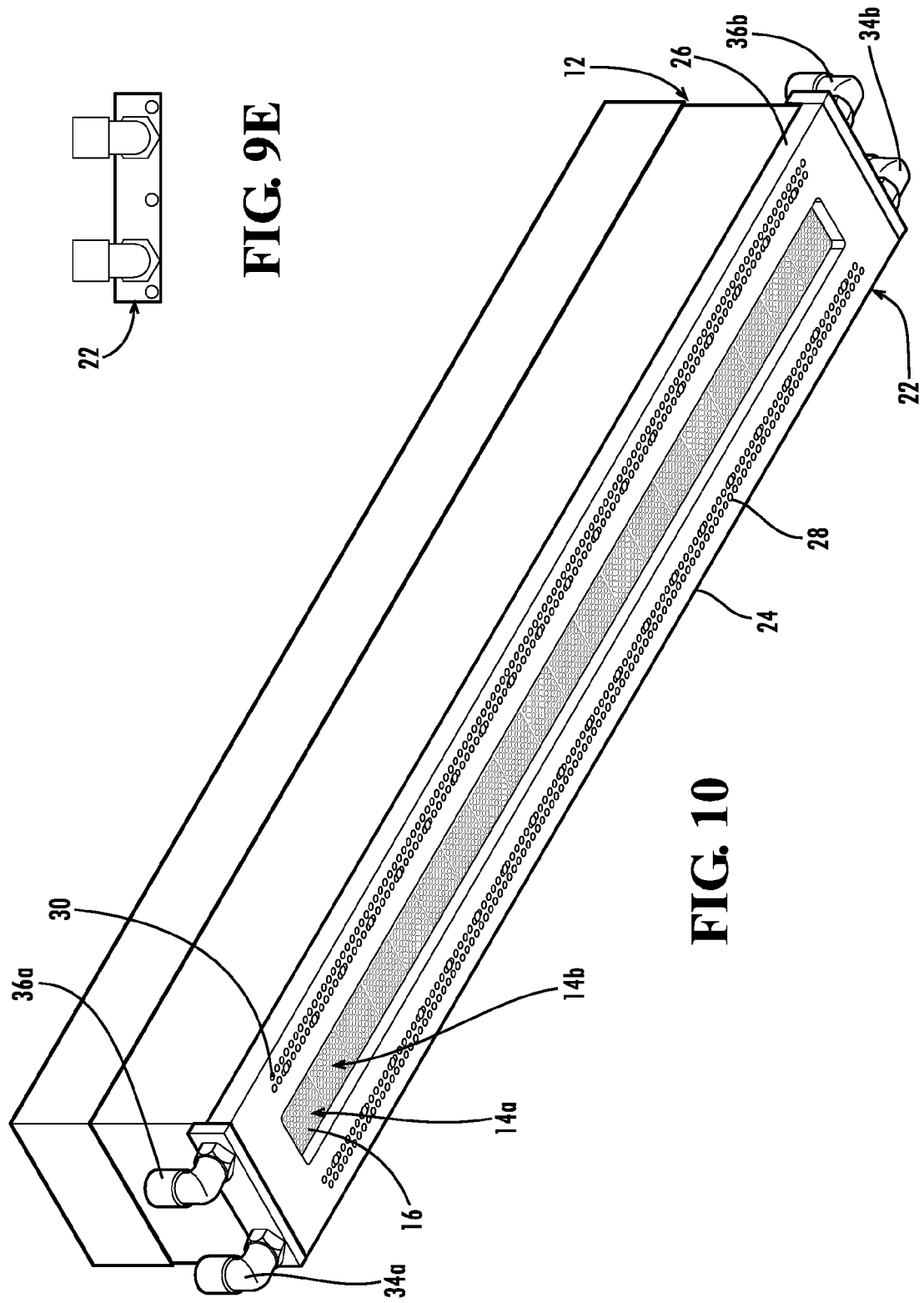
FIG. 9E
FIG. 10

US 7,642,527 B2

MULTI-ATTRIBUTE LIGHT EFFECTS FOR USE IN CURING AND OTHER APPLICATIONS INVOLVING PHOTOREACTIONS AND PROCESSING

CROSS REFERENCE TO RELATED APPLICATIONS

This application claims priority to and the benefit of U.S. Provisional Patent Application No. 60/755,331, filed Dec. 30, 2005, entitled MULTI-ATTRIBUTE LIGHT EFFECTS FOR USE IN CURING AND OTHER APPLICATIONS INVOLVING PHOTOREACTIONS AND PROCESSING, the contents of which are hereby incorporated by reference as if listed herein in its entirety for all purposes.

BACKGROUND

The inventive subject matter disclosed herein relate generally to systems and processes using two or more channels of light each having different light attributes. In certain aspects, the inventive subject matter relates to the use of a continuous channel of light output and a superimposed pulsed channel in curing a target material. In such curing operations, a laminar flow system and process may be employed to deliver an inerting fluid or a reactive reagent across the surface of the target material to cause desired effects.

There are many applications in which light (i.e., any form of electromagnetic radiation) is used for industrial processing. For example, light is used in curing of adhesives, curing and drying of printing ink, curing of coatings, producing sterile reagents, and direct cleavage of biochemical bonds. In such processes, the target object being processed often has regions with distinctive physical and chemical properties. The target object may also be subject to environmental conditions that vary from one region to another, on or within the target object material. Accordingly, some of the material regions being processed may respond independently to different or variable light effects, such as different intensities, wavelength(s), total optical power emitted by the source, source coherence, radiance of the source (power/area×steradian), degree of collimation, and power stability. Unfortunately, known lighting systems have not been adequate at providing variable multi-attribute light effects that are tuned to specific material regions of a substrate.

For example, FIG. 1A is a graph showing a light output profile having a continuous power output signal (which corresponds to a radiance, which in turn correlates to an irradiance at the target substrate). Conventional light sources, including all commercial LED sources used for curing, are generally run in a continuous mode, at the light source's highest output. A continuous profile has been used to provide a good depth cure in a substrate. Unfortunately, this continuous profile, if at a power for a good depth cure, does not allow sufficient curing of curable material that may be in contact with an inhibitor.

For example, looking at FIG. 3, an irradiated target object 1 is shown. Although the target object 1 may be any irradiated object or substance, the following discussion, unless otherwise indicated, will use a UV curable ink on a printing substrate, such as a film or paper, as the example target object. The UV curable ink is a layer that is disposed over at least a portion of a substrate. The layer may be divided into two zones, Zone A and Zone B. Zone A has a surface on which the inhibitor, e.g., oxygen in air, can act. The inhibitor may also diffuse some depth into the layer to a boundary defining a first side of Zone B, where there is little or no diffusion of inhibitor. A second side of Zone B interfaces with substrate S. Therefore higher power levels are required to overcome the inhibition at the surface of Zone A and within it relative to a Zone B, which is not enriched with inhibitor. The curing operation must provide good curing at the Zone A, and operating in a continuous mode at the higher power to achieve a good cure in Zone A usually results in over-curing in Zone B, damage to the substrate or diminished lifetime of the light source.

The problems with existing lighting systems can be illustrated by looking, for example, at the case of curing or drying of acrylate inks in digital graphics. The result of such curing should be a dry and high gloss product. This has been achieved by dissipating a large amount of energy into the polymer ink formulations. Conventional mercury doped lamps and heaters are used as the light source. The print media typically consists of a variety of materials, some of which can be addressed by a higher energy method, while others of which (e.g., plastics like polyvinylchloride, polyethylene, and polypropylene, as well as various heat sensitive substrates) cannot be so addressed.

In another example case—DVD bonding—thermal loading of the polycarbonate disks is a particularly vexatious problem that may occur at different levels in the disc where materials, such as adhesive, interface with other materials. In conventional processes, thermal loading may cause deviations in the finished disc, e.g., in the axial, lateral and thickness dimensions. These kinds of deviations may detrimentally affect the read and write characteristics of the disc, reducing overall yield of the production line. The problems will only grow worse as the industry migrates towards lower initiator concentrations, and lower wavelengths (higher energy radiation) used to read and write on the DVDs.

Another challenge in DVD manufacturing is uniform curing across zones: one where there is an aerobic environment and the other where there is an anaerobic or less aerobic environment. The edge of a DVD is a particularly aerobic zone and therefore has required special processing parameters relative to the other zones of the disc.

FIG. 1B shows an implementation of a set of continuous power output signals where various LED array sources can be combined operating at different power levels or wavelengths shown in FIG. 1B. This continuous approach is restrictive and leads to inefficient energy use, heat loading and undesirable properties in the polymerized zones. In addition the lifetime of the source is decreased. Further, operation of the LEDs at the higher power outputs required for a good cure of some zones in a target object, such as aerobically inhibited surface zones, seriously shortens the life of the LEDs, making them impractical for use.

In summary, the continuous modes of operations shown in FIGS. 1A-1B are problematic at processing different zones in a single target object and wasteful of energy, considering that they must operate at outputs dictated by the more demanding zone of a given substrate, or have other drawbacks.

LEDs have also been used in a pulsed mode instead of a continuous mode. In a pulsed mode, the light output cycles between zero power output to a peak power output. Pulsing alone is not sufficient to achieve good overall curing of a substrate that has curable regions that independently react to light. For example, FIG. 2 shows a pulsing profile where the peak power may be sufficient to cure at the surface of, and within, Zone A, but does not yield a good cure at depth, with "depth" represented by Zone B in FIG. 3. Adhesion of materials at depth may be an objective of a curing process. Adhesion generally depends on the polymeric properties at the interface of the Zone B curable material and substrate (S)

material, and pulsing that may afford curing in for Zone A cannot be controlled or optimized for good adhesion at the interface. Accordingly there has been a need for light systems that afford good curing at a surface zone and a depth zone.

Other approaches for overcoming the problem of edge curing include use of shutters and filters to vary the light exposure on a target object. But these systems are complicated, expensive, high-maintenance, and may require complex cooling systems.

In this regard, the prior art has attempted to differentially overcome aerobic inhibition by displacing air. For example, in DVD bonding this has been done by flooding the edge region of a disc with an inert gas, namely nitrogen. Unfortunately, flood inerting is inefficient and wasteful. (See *UV-Sheetfed Drying Under Oxygen Reduced Conditions*, by Joachim Jung, Peter Holl, Radtech 2004 Paper, IST Metz.) In addition to this, dynamic production processes, such as DVD production lines and printing-substrate belt-feed systems, are not amenable to isolation of the target object in a static reservoir of inerting gas. Therefore, these dynamic processes require a system where the gas that is used must be applied and purged from the point of treatment. Consequently, there are associated costs and potential hazards.

In view of the foregoing problems, there is a substantial need for improved lighting systems and methods that provide light to different zones of materials in a target object depending on the properties and requirements for each zone. There is also a need for improved systems and methods for introducing fluid flow to a zone of material for inerting the zone or for introducing a reactive reagent and thereby facilitate a desired photoreactive effect at the zone. There is also a need for such systems and methods to be efficient in terms of cost and effectiveness and relatively simple to implement and operate.

SUMMARY

The present invention overcomes the problems in the current technology by providing lighting systems and methods with multi-attribute light effects. These multi-attribute light effects optionally may be combined with the use of laminar flow fluids to further reduce the energy necessary to achieve the same amount of polymerization products. The flow reagents can be any fluidic compound used to modify the aerobic or exposed volumes of reagents. The light attributes may be provided in distinct channels representing a set of attributes. The channels are provided in one or more light sources using solid state emitters. A preferred lighting source is an array of solid state emitters formed on a substrate. While the following description may focus on specific curing applications, the inventive concepts and other matters described herein may be applicable to any number of applications in the ink, graphic arts, industrial coating, paints, bonding, adhesives application, and various other fields, as persons in the art will appreciate from the teachings herein.

Advantageously, the invention can control the reactions in the different zones differently, which is not feasible using conventional sources. By independently controlling light attributes in different regions in the layer of cured material, the properties associated with the various polymers employed in the industrial processes can be adjusted to fit a specific performance. Examples of these are if the adhesion is to be promoted the reactivity at the interface to the substrate would be adjusted to promote bonding to the material of the substrate or if a hard non-flexible surface is desired the increased pulsing can promote cross linking in the top boundary layer while maintaining the adhesion with less cross linking at the substrate.

The inventive subject matter also contemplates one or more light sources configured to emit multiple wavelengths on the continuous or pulsed channels. The adjustment of the wavelength intensities allows the light source to attain maximum coupling efficiency into the atomic and molecular absorption bands of the respective zones. This avoids thermal loading, undesired reaction in zones and/or extends the lifetime of emitters, while achieving the desired polymerization for each zone.

In one possible embodiment, the inventive subject matter contemplates a method for performing a photo reaction on a target object, comprising: emitting from a light source a continuous output of irradiance onto the target object having a first photo-reactive zone A, and a second photoreactive zone B; superimposing over the continuous light output a pulsed light output of irradiance onto the target object, with the pulsed output having a peak irradiance level greater than that of the continuous light output; and wherein the target object has a first zone A that has a photo-reactive character that is different from a zone B, and the pulsed light output enhances a photo-reaction in zone A relative to the continuous light output. In the method, the light source may include an array of solid state light emitters having a power output/$cm^2$ from about 500 mW/$cm^2$ to about 4 W/$cm^2$. In the method, the wavelength of light from the first and second channels may be within the range of from about 1800 nm to about 150 nm. In the method, the wavelength of light from the first and second channels is within the range of from about 420 nm to about 150 nm. In the method, the continuous emission may have an irradiance within the range of from about 100 mW/$cm^2$ to about 10,000 mW/$cm^2$. In the method, the continuous emission may have an irradiance within the range of from about 100 mW/$cm^2$ to about 1.5 W/$cm^2$. In the method the pulsed emission may have a peak irradiance within a range of from about 5 W/$cm^2$ to about 5000 W/$cm^2$. In the method, the pulsed emission may have a peak irradiance within a range of from about 1 W/$cm^2$ to about 30 W/$cm^2$ and the ratio for the peak of the pulse to the base of the pulse is at least about 0.02 to about 100. In the method, the duty cycle for the pulsed emission may be from about 1%-50% at about 0.02 Hz to about 40,000 Hz. In the method, the duty cycle for the pulsed emission may be from about 1%-25% at 0.02 Hz to about 40,000 Hz. In the method, the duty cycle for the pulsed emission may be from about 1%-10% at about 0.02 Hz to about 40,000 Hz. In the method, during light output a laminar flow may be introduced across a surface area of the material exposed to the light. In the method, an inerting agent may be introduced via the laminar flow.

In another possible embodiment, the inventive subject matter contemplates a system for performing curing of target object, comprising: a light source comprising an array of solid state light devices configured for providing onto the target object a (i) first channel of light output comprising a substantially continuous pulse of light emission, and (ii) a second channel of light output comprising a pulsed light emission, both channels being within a wavelength range sufficient to caused desired curing in the target object, and wherein the second channel pulsed emission of light at a peak irradiance is in the range of about 2 to about 100 times greater than that of the irradiance of the continuous emission. The system may be enabled to perform any of the methods contemplated above and below.

In another possible embodiment, the inventive subject matter contemplates a method comprising: providing a flow of a fluid over at least one surface zone of a target object; exposing the target object to a light that fosters a reaction in association with the at least one surface zone of the target object; and wherein the light comprises light from a solid state light source, the light source outputting to the target object a light profile comprising a continuous mode of output and a super-imposed pulsed mode.

In another possible embodiment, the inventive subject matter contemplates a product comprising a photo-reacted target object, the target object being formed by a method comprising: emitting from a light source a continuous level of irradiance onto the target object having a first photo-reactive zone A, and a second photoreactive zone B; superimposing over the continuous light output a pulsed light output having a peak irradiance level greater than that of the irradiance level of the continuous light output; wherein the target object has a first zone A that has a photo-reactive character that is different from a zone B, and the pulsed light output enhances a photo-reaction in zone A relative to the continuous light output.

In another possible embodiment, the inventive subject matter contemplates A product comprising a photo-reacted target object, the target object being formed by a method comprising: providing a laminar flow of a fluid over at least one surface zone of a target object; exposing the target object to a light that fosters a reaction in association with at least one surface zone of the target object; and wherein the light comprises light from a solid state light source, the light source outputting to the target object a light profile comprising a continuous mode of output and a super-imposed pulsed mode.

In the foregoing methods, systems and products, the target object may be a CD or DVD.23; the light output may be provided by groups of emitters comprising a first group of one or more emitters dedicated to the continuous output and a second group of emitters dedicated to providing the pulsed output; the output may be provided by a group of emitters dedicated to providing both the continuous and pulsed outputs; the output may be provided by groups of emitters comprising a first group of one or more emitters dedicated to the continuous output and a second group of emitters dedicated to providing the pulsed output; the light output may be provided by a group of emitters dedicated to providing both the continuous and pulsed outputs; the continuous and pulsed output profiles, respectively, may be selected so as to couple into respective absorption bands for predetermined Zone A and Zone B photo-reactants; the polymerization reagents in the target object may comprise a photo-initiator compound and a monomer or oligomer reactive with the compound; and/or the polymers may be selected from the group consisting of epoxies, acrylates, polyimides, and polyamides. The methods may be applications for curing inks; automotive coatings; industrial coatings; cement or concrete coatings; adhesives; tape release polymers in semiconductor processes; paints; and/or lithography. The methods may be applications for cleaning or sterilizing the target object.

These and other embodiments are described in more detail in the following detailed descriptions and the figures.

The foregoing is not intended to be an exhaustive list of embodiments and features of the present inventive concept. Persons skilled in the art are capable of appreciating other embodiments and features from the following detailed description in conjunction with the drawings

BRIEF DESCRIPTION OF THE FIGURES

FIG. 8A shows a schematic perspective view of an arrangement of a light source system and a curable material that moves under the light source, along with an optional inerting system.

FIG. 8B is an enlarged sectional view of the encircled portion in FIG. 8A labeled "8B".

FIG. 9E is an end view of the inerting fixture of FIG. 9A.

FIG. 10 is a perspective of the assembly of the light source and optional inerting fixture from the inerting system of FIG. 9A.

DETAILED DESCRIPTION

"Target object" means any material(s) or substance(s), in any singular, composite, or structural form, that is intended to be exposed to a light (any form of electromagnetic radiation) from a light source to effect a photoreaction. A target object may be an area on another object. For example, the target object may be an area consisting of application of a curable printing ink on a moving sheet of printing substrate. As used herein "zone" means any surface, region, section or portion of a target object.

A target object may be defined in terms of a plurality of zones, each representing independent chemical or physical properties, environmental conditions (e.g., surrounding media, reactants, reagents, temperatures, flow conditions, etc.), and/or photo-processing requirements. Accordingly, each zone may have a corresponding channel of light, emitted by one or more light sources, having one or more specific attributes, such as wavelength, pulse time, intensity, etc.

One exemplary embodiment of the inventive subject matter provides one or more light sources capable of emitting one or more channels of continuous radiation and one or more channels of pulsed radiation. The light sources may be the same emitter, or separate emitters that can be combined with multiple wavelengths which can be addressed individually or in arrays. The sources can then be coupled into the respective absorption bands of the materials for maximum efficiency.

Figure 11:
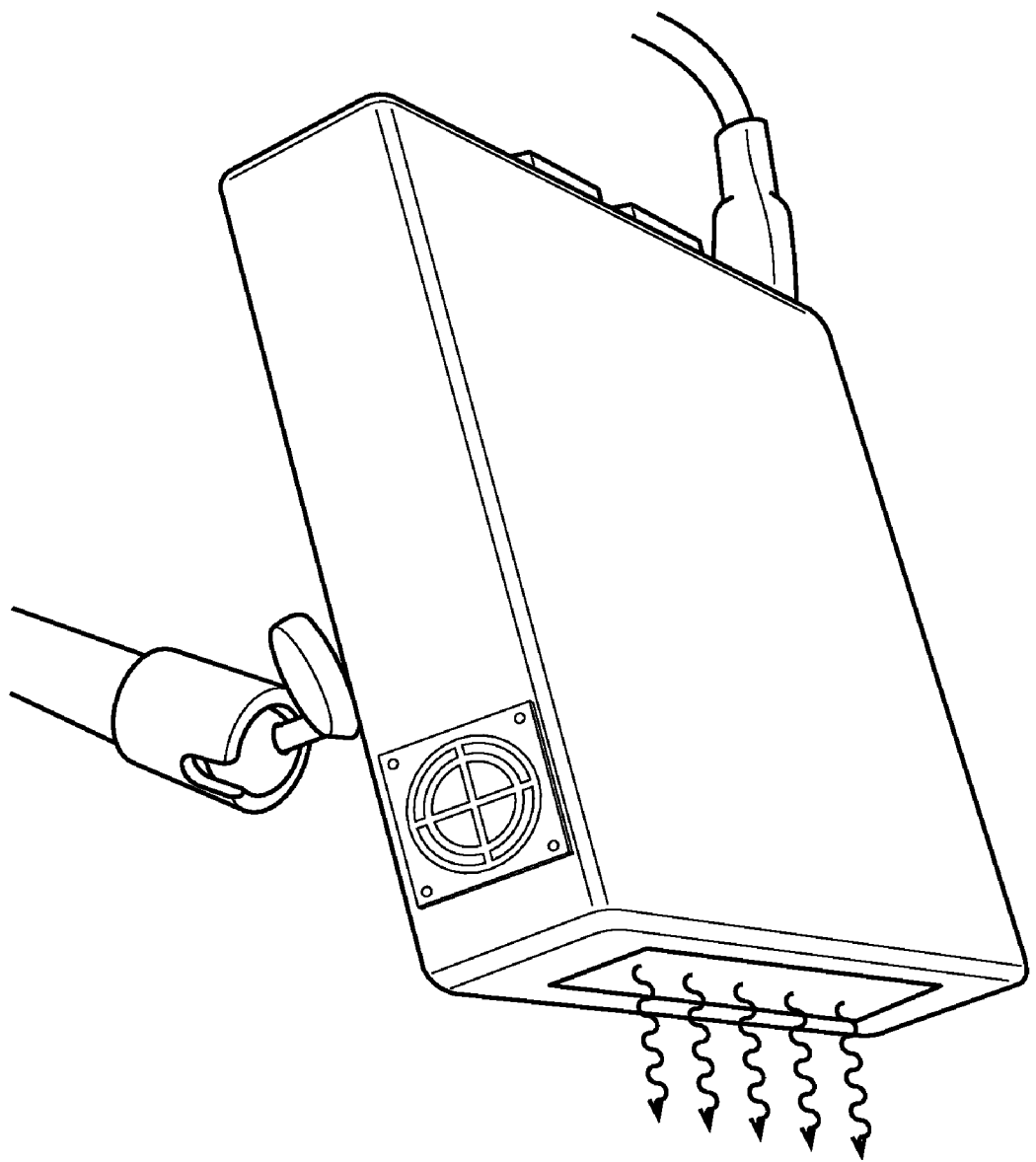
FIG. 11 shows an example of a light source for use in systems and methods according to the inventive subject matter.

Each channel may be a single frequency having a selected intensity. Alternatively, either channel may have a plurality of selected frequencies and/or have one or more frequencies that vary with time. As well, a channel's intensity may vary with time (and, if the channel has plural frequencies, the intensity may vary among such frequencies and/or one or more of such frequencies may vary over time). Each channel may also have different wave forms. Each channel may also have other different or varying attributes (e.g., source coherence, radiance of the source (power/area ×steradian), degree of collimation, power stability, etc.). It is understood that how a particular light source will be configured or controlled will vary from application to application, and persons skilled in the art will appreciate how to adapt a light source for a particular application based on the teachings herein. Solid lighting arrays suitable for use in various embodiments described herein are commercially available products from Phoseon Technology, Inc. of Hillsboro, Oreg. Models include the RX line of products, such as RX STARFIRE™, RX20™, and the RX FIREFLY™. For example, The RX STARFIRE™ system is designed as a high intensity UV light "bar" with configurable emitting lengths of 75 mm, 150 mm, 225 mm and 300 mm with an emitting width of 20 mm. FIG. 11 generally shows the RX STARFIRE™ light source. The RX STARFIRE™ can be either air cooled or water cooled. The RX STARFIRE™ is particularly suitable for applications in the inkjet market and can be easily integrated into production systems. The foregoing products use solid state light arrays, as taught in PCT patent Application PCT/US03/14625, filed May 9, 2003, "High Efficiency Solid-State Light Source and Methods of Use and Manufacture," which is hereby incorporated by reference in its entirety for all its teachings. Suitable light sources are discussed in more detail below.

Figure 4:
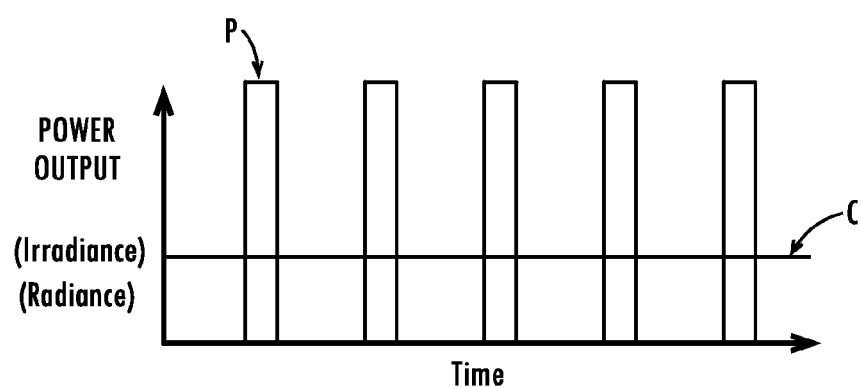
FIG. 4 is a graph showing a profile of power over time, according to the inventive subject matter disclosed herein.
Figure 5:
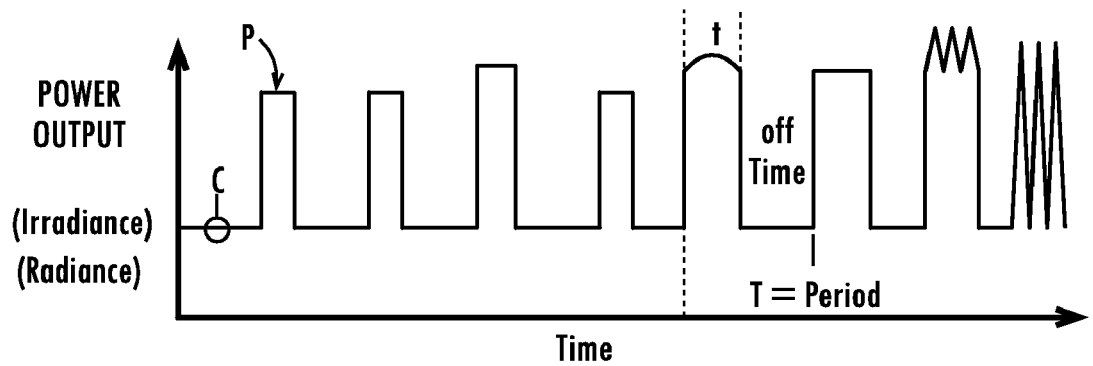
FIG. 5 is a graph showing a profile of power over time, according to the inventive subject matter disclosed herein.
Figure 6:
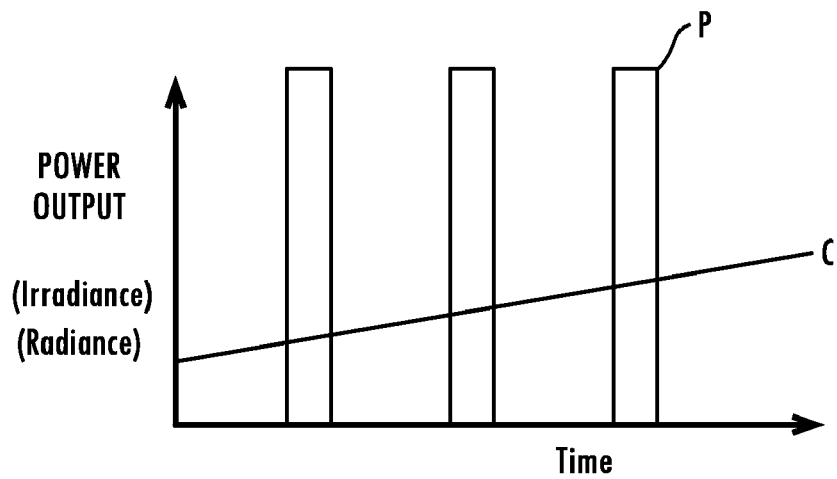
FIG. 6 showing a profile of power over time, according to the inventive subject matter disclosed herein.
Figure 7:
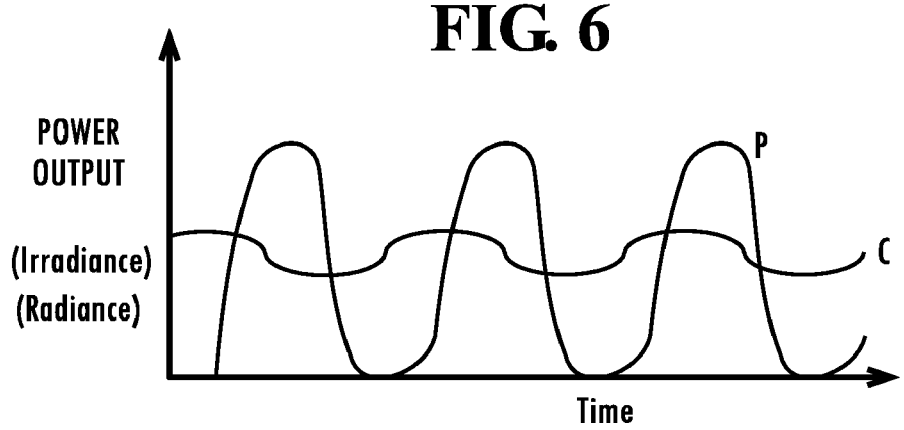
FIG. 7 is a graph showing a profile of power over time, according to the inventive subject matter disclosed herein.
Figure 9A:
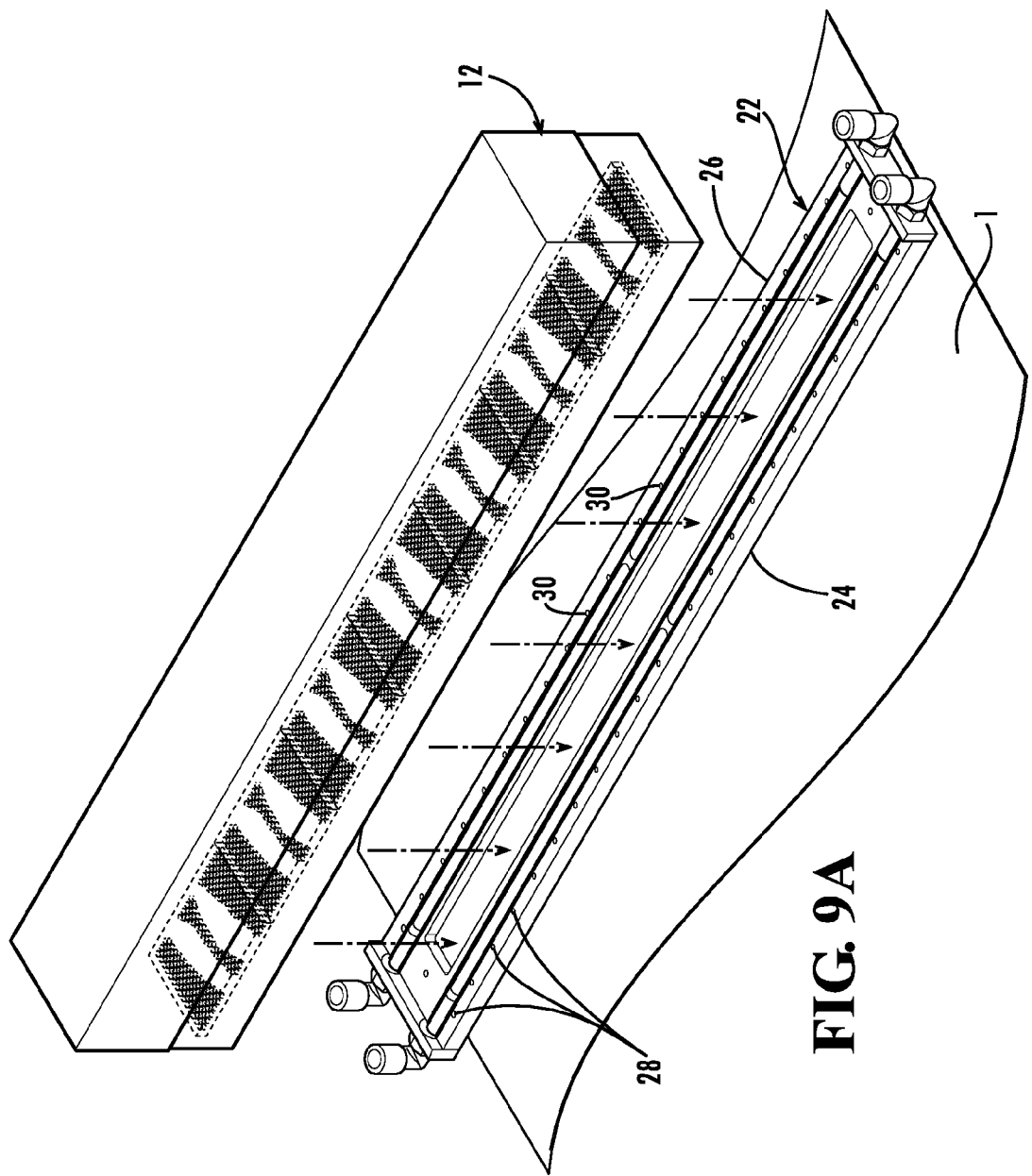
FIG. 9A is an exploded perspective view of the light source and an optional inerting fixture from the inerting system of FIG. 8A.
Figure 9B:
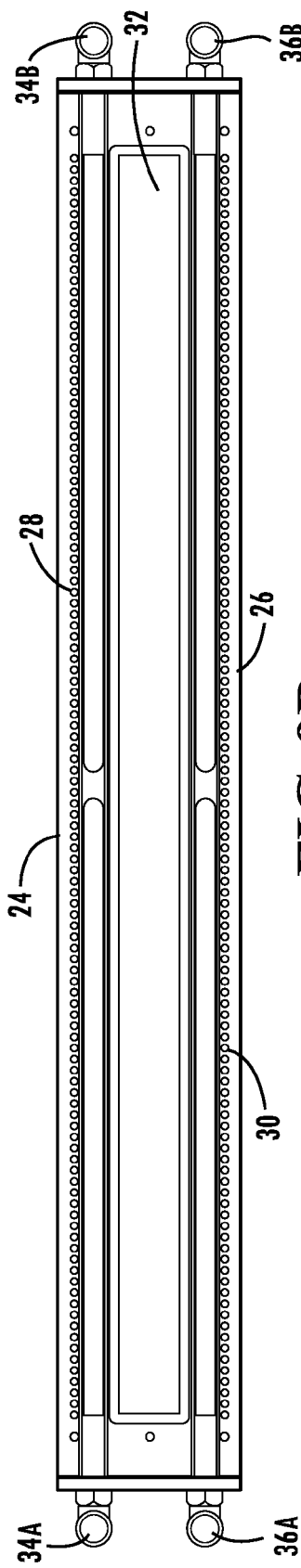
FIG. 9B is a top view of the inerting fixture of FIG. 9A.
Figure 9C:
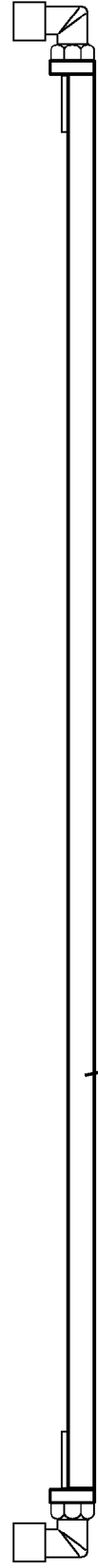
FIG. 9C is a side view of the inerting fixture of FIG. 9A.
Figure 9D:
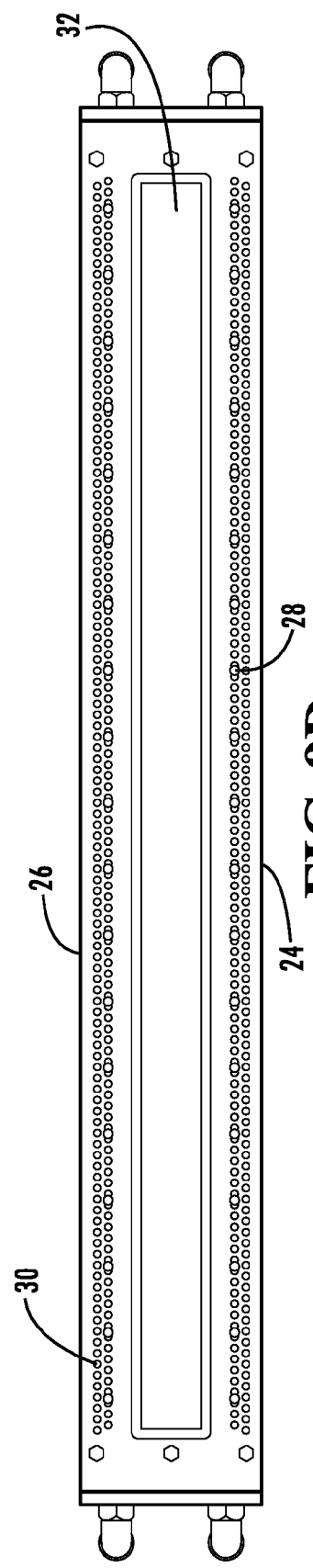
FIG. 9D is a bottom view of the inerting fixture of FIG. 9A.

In certain embodiments, the one or more channels of continuous radiation serve as a base power output for the one or more channels of pulsed radiation. In other words, a pulsed channel is superimposed over a continuous channel. (The superimposition may also be referred to as "super-pulsing".) The superimposition may be achieved by using one or more light emitters that are dedicated to providing the continuous light output and one or more light emitters that are dedicated to providing a pulsed light at an output above a base of the continuous light output. An example output profile for this arrangement is shown in FIG. 4 (discussed in more detail below). Another possibility is to use the same emitters that provide the base power output and pulse them at an output level above a base power level in the continuous mode. In other words, a set of emitters is dedicated to providing both the continuous and pulsed modes of output in a power profile. An example of this is shown in FIG. 5. As can be seen, the net effect of either approach is the same, and the term "superimpose" and variations of this term are meant to cover either approach. It is also noted that the continuous and pulsed power profiles discussed herein are in the context of application to a particular target object, and not necessarily what a light source outputs in between treatments of a target object. It is noted, that while the power output profiles for FIG. 6-7 are shown as separate lines, P and C they could also be represented as a modulated line from a single set of emitters dedicated to continuous and pulsing modes, similar to FIG. 5, or there can be a combination of the approaches of FIGS. 4 and 5 to generate a single overall profile (not shown).

As used herein "continuous" means a base power output over which a pulse of relatively higher power is superimposed. Typically, the continuous mode will be a uniform power output over time and the duty cycle of the pulsing will be a fraction of the continuous power mode. However, it is also within the scope of the inventive subject matter for the continuous mode to be a non-uniform base relative to the pulsing. For example, the base pulse could vary over time and still serve as a base relative to the superimposed pulses. The base pulse might have a slope over time (FIG. 6) or be modulated (FIG. 7), or some combination thereof. It will be appreciated that such profiles can serve as a base for superimposing relatively higher output pulsing. Accordingly, the term "continuous" is intended to cover any form of base pulse over which a relatively high power pulse with a relatively short duty cycle is superimposed. The duty cycles may be run at from about at 0.02 Hz to about 40,000 Hz.

In certain embodiments, each channel is provided by addressing selected solid state emitters in an array of emitters, or by having separate arrays or single light emitters dedicated to a particular channel. Light sources that emit in a wavelength range of between about 250 nm and 450 nm are specifically contemplated for use in certain curing processes.

FIGS. 4-7 show various possible examples of a light output profile according to the inventive subject matter. The profiles show a continuous mode of power output with a superimposed pulse mode of power output. Each pulse is part of a "duty cycle". A duty cycle is the percent of a period emission that the high intensity pulse is on relative to the base of the continuous power output (Pulse width/period (t/T)). FIG. 5 shows t/T for a single duty cycle. FIG. 5 also illustrates that the pulsing profile may take many forms. For example, as indicated by the first two duty cycles (starting at left), it could have uniformity in terms of spacing of duty cycles and wave form. The third duty cycle shows one possible variation where a pulse in a profile has a different peak power and/or a different pulse width. The fifth duty cycle shows a pulse that has a rounded peak and greater width. It also comes sooner at a higher frequency than earlier pulses. The sixth pulse shows another variation. The seventh pulse shows a stacked-pulse where a pulsing profile of three pulses is superimposed over the top of a flat pulse. The eighth pulse represents a pulse formed from a group of tightly clustered of sub-pulses.

Figure 1A:
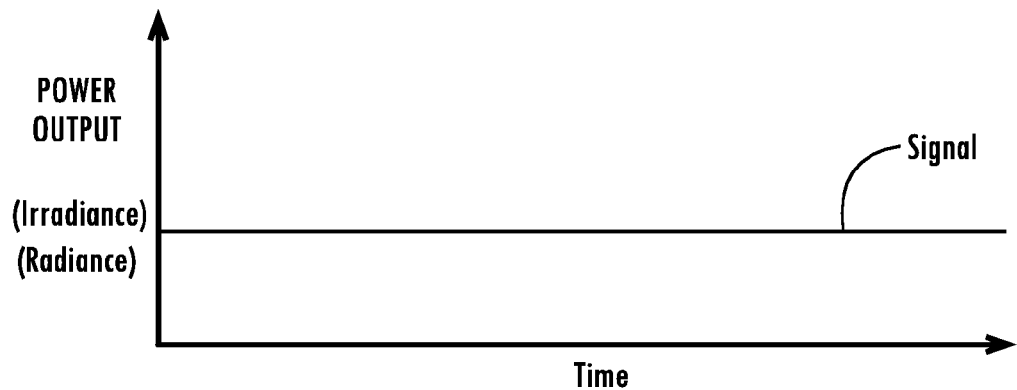
FIGS. 1A and 1B are graphs showing a prior art profile of power over time, according to the inventive subject matter disclosed herein.
Figure 1B:
Figure 2:
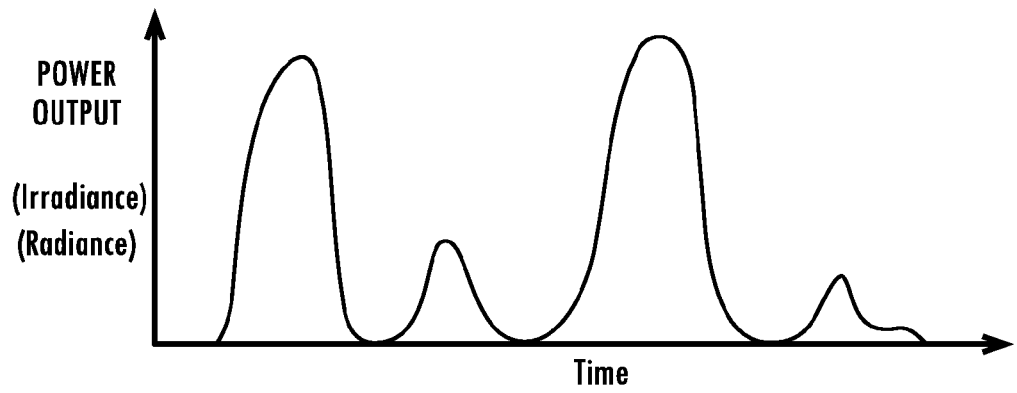
FIG. 2 is a graph showing a prior art profile of power over time, according to the inventive subject matter disclosed herein.
Figure 3:
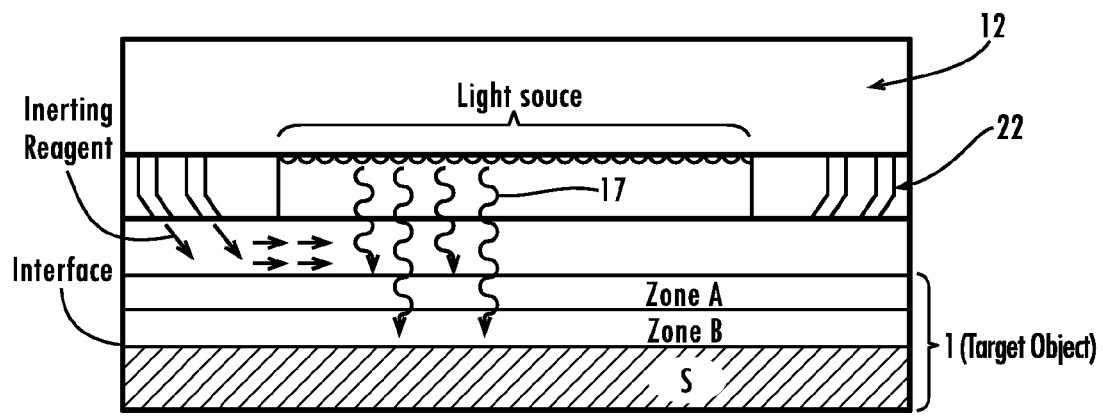
FIG. 3 shows a schematic side view of an arrangement of a light source and a curable material, along with an optional inerting system.

Looking at the example target object 1 of FIG. 3, to achieve a full cure in both Zone A and Zone B, using the profiles shown in FIGS. 1A and 1B and/or FIG. 2, the irradiance must be high enough to overcome any inhibition in Zone A. In certain curing operations such as ink curing, the irradiance required to achieve a good cure in Zone A leads to a total energy requirement that is 50 to 60 times the energy required to cure the respective volume or mass of the curable material on the substrate. In contrast, the modes (continuous/pulse channels) shown in FIGS. 4-7 are used to reduce the energy required to achieve the desired cure level (degree of polymerization, chain length distribution) in Zone A and Zone B by addressing them separately. In addition to curing and other photo-reactions, the inventive subject matter may also be used to inspect, clean, or sterilize a target object. For example, IR bands of light are used in inspection of semiconductor materials. UV bands are used to clean and sterilize surfaces in a of a wide variety of applications, including semi-conductor manufacturing, food processing, and hospital settings, etc.

The continuous or base line C may be used to provide good curing of a bulk layer in a target object, such as Zone B in FIG. 3, and the pulsed wave form P may be used to provide a higher peak irradiance (power/area) relative to line C for good curing for boundary Zone A. In addition, the line C power mode provides excellent adhesion to the substrate S. Although the wave form P is shown as a square wave, it may be provided in any combination of irradiance levels, duty cycles, and/or periods.

The desired peak irradiance level (duty cycle/period) is adjusted to overcome inhibition without effecting bulk cure. This may be done because there is a finite amount of inhibitor in the boundary layer Zone A, which needs to be reacted before the desired curing of the material can take place. It is understood that various parameters of the cured polymers can be continuously adjusted by the peak irradiance, duty cycle, and period superimposed on the continuous irradiance.

The duty cycles for a curing application can be as high as 95%. The best results are typically obtained when the duty cycle is between about 1% to about 10% for all curable materials, for example, polymerization reagents in polymer, copolymer and alternating copolymer formulations. These include but are not limited epoxies, acrylates, polyimides, polyamides. Both cationic and free radical polymerization reactions benefit from the methods. The curable materials are used in various applications, including inks (e.g., ink jet, offset, flexographic, screenprint, ceramic, transferable media), automotive and industrial coatings, cement and concrete coatings, and adhesives, tape release polymers in semiconductor processes, paints 10 (e.g., automotive, house, concrete, and marine), lithographic applications (e.g., resists, dielectrics, micro imprint, and nano imprint).

In FIG. 4, the pulsed and continuous modes, irradiance may be generated by a single emitter or a single array, with the drive power being distributed uniformly across the emitters in the array, for example. Alternatively, FIG. 5 illustrates, from the third duty cycle on, how the pulsed irradiance output may be varied in any combination of irradiance levels, duty cycles, and/or periods.

Accordingly, from the foregoing teachings, it can be seen that the properties of both Zone A and Zone B can be adjusted independently by using separate channels, each with distinct light attributes, for example, different intensities for C or P and modulating the duty cycle, on-time/off-time within a period of the pulsed source or array (P). The proper combination of the pulsed and continuous sources allows the reduction in the energy required to achieve a desired effect. In addition to facilitating uniform polymerization in different zones, the adjustment of the pulsed and continuous components of the irradiance may also facilitates control over a differential polymerization in different zones. This allows the user to effectively achieve different performance of the final polymer related to cross linking, chain length and chain length distribution.

By exposing the bulk of a curable material to a low-power continuous dose of electromagnetic radiation while simultaneously curing the layer in contact with the inhibitor (or otherwise benefiting from a higher dose of light energy) with a high-intensity, low duty-cycle pulse from the light source, the inventive subject matter also overcomes the problem of wasted energy that is intrinsic to the prior art.

The inventive concepts are particularly suitable for use in bonding functional and decorative layers of optical storage media such as CDs and DVDs. The key aspect of the construction of these optical media is they are bonded together with adhesives. This will likely remain the same although the actual components used to form layers will change as the industry moves to other standards like Blue Ray and HD-DVD (High Density Digital Versatile/Video Discs). In an exemplary embodiment for UV curing of an optical storage media, the inventive concept is directed to an array of LEDs (see description of solid state light emitters below) that are run at a constant nominal current of 0.54 Amps with an irradiance of 0.5 W/cm$^2$ with a secondary signal attached to this constant DC signal, with a Pulse Rate of 200 Hz and pulse width of 62.5 μs achieving a Peak irradiance of 10.5 W/cm$^2$.

FIGS. 8-10 show a light system 10 for exposing a target object 1 positioned below the system. The system includes a light source 12. The light source may use a set of one or more arrays 14a-14f of solid state light emitters 16, such as LEDs, formed on a substrate material. The light source emits light rays 17 onto target object 1. The system includes a power source 18 for powering the emitters. The power source may include an optional feedback mechanism for sensing irradiance at the target object and/or temperature, and regulating power according to set parameters. The system would also include controls 20. Typically controls would include a processor for controlling lights and a user interface, which could be hardware, such as switches, buttons, or screen displays, with associated input means, such as keyboards, mousse, and touch screens. There may also be associated software or firmware for configuring the system to provide light output profiles according to the teachings herein, and appropriate storage for storing executable code and related data from an input device. An optional fixture 22 for creating a predetermined fluid flow 23 is shown associated with light source 12. This fixture is described in more detail below under the discussion of laminar flow, which is a representative form of fluid flow.

In accordance with other inventive concepts, the replacement of the existing flood curing systems can be achieved in a DVD bonding application. To address the problems identified in the Background section for DVD bonding, the present inventive concepts contemplate a first channel that is used to cure the anaerobic zone of a disc and a second channel to cure the aerobic zone, on the edge of the disc. In an alternative embodiment, an LED array is used for emitting the light for the first channel to achieve the anaerobic cure, and a laser light source is used for emitting light for the second channel to achieve the higher energy density used for the aerobic portion of the DVD (edge).

Laminar Flow System

In exemplary embodiments, the inventive subject matter provides systems and methods for a reaction at or below a selected portion of a surface of a target object such that a fluid flow is created to foster the reaction. Suitable systems and methods for such fluid flow are taught in PCT/US2005/047605 (WO 2006/072071), entitled METHODS AND SYSTEMS RELATING TO LIGHT SOURCES FOR USE IN INDUSTRIAL PROCESSES, with an international filing date of Dec. 30, 2005, and is and was under common ownership as the inventive subject matter disclosed herein at the time it was made. The application is hereby incorporated by reference in its entirety for all it teaches. The reaction fostered by the fluid flow may be a photoreaction (e.g., a reaction associated with application of light energy). As used in this application, (a) "fluid flow" means flow of one or more selected fluids, at one or more selected times, over or otherwise in association with at least one selected surface of a target object or substrate, so as to foster a particular reaction; and (b) "foster" means to promote, enable or otherwise contribute to a reaction so that such reaction is properly effected (e.g., the reaction initiates, proceeds and/or is completed without or substantially without inhibition, interference or other detrimental effects, such as those caused by the presence of oxygen or other inhibitor and/or, as the case may be, other impurity, contaminant or material which, if present or present at or above a particular metric, may be at odds with the reaction).

In exemplary embodiments, a reaction is fostered by creating fluid flow in association with at least one selected portion of a work object. The fluid flow may be associated with the selected portion by a selected fluid flowing over the selected portion.

In exemplary embodiments, the fluid may comprise an inerting fluid. Examples of such inerting fluid include nitrogen or other inert gas or liquid, alone or in combinations. Examples of such inerting fluid also include gases or liquids selected to react with oxygen or other inhibitor or material(s), so as to produce an inert product (e.g., a product that will not inhibit the reaction or otherwise be at odds with fostering the reaction).

In exemplary embodiments, the fluid may comprise a reactive species. In such embodiments, the fluid reacts (e.g., photoreacts) with another species in a predetermined manner. Such another species typically is a component of, or is used in making, the work object. Such another species may also be an inhibitor, an impurity, a contaminant or other undesirable material.

In exemplary embodiments, the fluid may comprise a catalytic species that catalyzes the reaction (e.g., a photoreaction) in a predetermined manner.

In exemplary embodiments, the fluid may comprise combinations of one or more inerting, reactive, catalytic or other species. Any such combination may be provided at once (e.g., in mixtures or other chemical combinations), in sequences (e.g., separately or in mixtures or other combinations), or both. Any such combination may be provided variously over different portions of the target object whether at once, in sequence or both.

In exemplary embodiments, the reaction comprises a photoreaction employing a selected light source. The selected light source may be any known light source, for providing light appropriate to the photoreaction. Such light source, generally, addresses various parameters, e.g., particular wavelength(s) and power for a particular photoreaction.

In exemplary embodiments, the light source is a solid state light source. Without limiting the generality of the foregoing, the solid state light source may comprise a dense array of light emitting diodes (LEDs).

In an exemplary embodiment, fluid flow provides a desired inerting agent or reactive species to at least one selected portion of a surface of a target object to displace, remove or otherwise substantially mitigate or overcome the action of a predetermined agent that inhibits, interferes with, has a detrimental effect on or otherwise is at odds with a photochemical reaction or other predetermined reaction or processing at or in the surface of the target object or substrate.

In another exemplary embodiment, the fluid combines with another species to form one of an inerting, reacting or catalytic species. In another exemplary embodiment, the fluid flow can be a unidirectional fluid flow. In still another exemplary embodiment, fluid flow can be a multi-direction fluid flow (e.g., flowing in two directions at the same time, typically at two different locations and/or flowing in one direction at one time and in another direction at another time). In yet another exemplary embodiment can a radial fluid flow. In a further exemplary embodiment, the fluid flow can be without or without substantial turbulence (in such case, the fluid flow may be referred to herein as "laminar flow"). Alternatively, the fluid flow can be with a selected degree of turbulence.

In other exemplary embodiments, the fluid flow direction and nature, and other of its parameters may be selected, so as to provide one or more characteristics. Such selections typically are in the context of application of the fluid flow. As examples of this contextual selection, such selections typically respond to the reaction, the work product's components, the environment (including inhibitors and other materials), and the light source. Such selections are contemplated to include anyone or more of the above-described types of fluids, flow directions, flow natures and other parameters, together or separately from other fluid types, flow directions, flow natures and other parameters.

Advantages of the inventive subject matter disclosed herein are provided by a device and a method for enabling a reaction (e.g., a photoreaction) at or below a surface of a target object or substrate, in which a fluid flow is provided over or otherwise in association with such surface of the target object, the target object being exposed to a multi-channel light source, as described above, so as to foster the reaction at or below the surface of the target object or substrate. In one exemplary embodiment, the fluid comprises an inerting species, and the reaction is a photoreaction that would be in an aerobic environment, but for the fluid flow. The inerting species could be, for example, nitrogen, carbon dioxide, argon and/or helium. In another exemplary embodiment, the reaction is for a polymerization reaction. In still another exemplary embodiment, the fluid comprises a reactive species. In yet a further exemplary embodiment, the fluid comprises a catalytic species. In one exemplary embodiment, the fluid flow is substantially parallel to a portion of the target object.

The reaction (e.g., a photoreaction) could be for curing an ink formation on a substrate. Alternatively, the reaction could be for curing a coating on a target object. As yet another alternative, the reaction could be for setting an ink.

In one exemplary embodiment, the target object includes first and second layers of material and a third layer of material between the first and second layers, and the reaction (e.g., photoreaction) enables the third layer of material to bond the first and second layers of material together. For example, the target object could comprise a precursor for optical storage media, such as a CD-type device, a DVD-type device, a Blue Ray DVD-type device or an HD-DVD-type device.

In another exemplary embodiment, the light comprises one or more wavelengths of between about 250 nm and 450 nm. In one instance of such embodiment, the light is generated by one or more light sources comprising one or more solid-state light emitters source, the one or more light sources being enabled to provide multiple channels of light. In certain embodiments, one channel is a continuous channel and another channel is a pulsed channel.

The inventive subject matter disclosed herein also provides various methods directed to fluid flow. In an example embodiment, a method is provided for applying inert fluid, such as nitrogen, carbon dioxide, or the like, to the edge of a rapidly moving substrate involving UV-cured materials, such as inks, coatings, or adhesives, so that a chemical reaction can be fostered (e.g., without being exposed to, or otherwise mitigating, the detrimental effects caused by the presence of oxygen). In such example method, the inert fluid may provide a layer in association with the edge.

Looking now at some particular applications, laminar flow may be used, for example, to generate a small layer at the interface of the fluid flow and a curable material as an economical and effective method to achieve the suppression of oxygen inhibition. This technique is particularly effective when combined with free radical polymerization reactions used in ink jet printing, DVD printing, screen printing, adhesive layer polymerization, coatings for automotive, coatings for structural use, industrial coatings, LCD (Liquid Crystal Display) materials, photoresists in lithography and OLED manufacturing processes.

Typically the light sources used in the prior art polymerization reactions are mercury, fluorescent bulbs, halide bulbs, Xenon, lamps, excimer lamps. These lamps all emit UV in bands and therefore are much less efficient in terms of coupling to the material. The use of the SLM (solid state matrix) UV sources allows for the absorption of up to 90-95% of the total energy, whereas the conventional sources only couple as efficiently as 25% to contribute to the polymerization. This is a benefit that is associated with using a smaller bandwidth source like LEDs or SLMs. The combination of the inerting layer allows for the curing of materials at ½ to ¹/25 the total energy necessary. This is believed generally possible for by all free radical polymerization reactions.

A particular application of light that has significant economic implications in today's industrial application is the polymerization of adhesives and light sensitive polymers, particularly those which are irradiated through low transmittance layers. The absorption of light in a specific wavelength by the material that is to be bonded, sealed, or chemically altered by a polymerization reaction (e.g., a reaction that is catalyzed by the specific wavelength) presents a significant hurdle in a number of industrial applications today. In some chemical reactions, the presence of oxygen tends to have a detrimental effect on the chemical reaction.

In this case the use of a laminar flow with low concentrations of oxygen will decrease the amount of energy necessary to overcome the inhibiting effect. The laminar flow can consist of any number of low oxygen concentration flows, such as $CO_2$, nitrogen, argon, helium, and others. It can also be beneficial to use pure reagents in a laminar flow to promote a desired reaction.

In one exemplary embodiment, the inventive subject matter provides a directed laminar-flow jet of nitrogen (though carbon dioxide or other inert gases could be use) encased in the mechanical assembly that holds and transports a CD/DVD through its stages of manufacture. A fixture for CD/DVD laminar flow inerting is illustrated and taught in PCT/US2005/047605 (WO 2006/072071), which was incorporated by reference above. It should be understood, though, that the inventive subject matter disclosed herein is not limited to use with nitrogen and that carbon dioxide and other inerting gases and/or fluids could be used. There are many problems that must be overcome when applying an inert atmosphere to the edge of a CD/DVD. First, in order to achieve uniform light exposure over the entire CD for the photoreactive process, the CD/DVD is kept spinning during exposure. The mechanism is a spindle or circular platform that is spun by an electrical motor. A spinning motion, however, results in mixing of the inerting fluid with oxygen. Consequently, a simplistic approach of merely aiming nitrogen jets at the edge of a spinning CD results in sufficient turbulence that excess oxygen is mixed in with the nitrogen and the resulting oxygen concentration is sufficiently large so as to impair curing. Immersing the entire assembly in nitrogen is not practical because the manufacturing volume is too large, and because humans must be able to access the processing area.

The target object is located below the multi-attribute light source and the station rotates to position the target object below the light where the radiant energy polymerizes the reagent materials. An example of a system that functions in this manner is a DVD screen print machine. The laminar flow is created between the space of the target object station and the light source while the station is traversing into position under the multi attribute light source. The laminar flow fixture can be mounted on the light source to accommodate either direction of workflow.

In a specific application of DVD bonding using an inerting fixture illustrated and taught in PCT/US2005/047605 (WO 2006/072071), the laminar flow of about 0.5 to about 61 /min is produced by the judicious choice of the nozzle spacing, flow distance and volume in the fixture. A Reynolds Number below 1000 is targeted for the aforementioned flow conditions for gases with a range of temperatures from 25-125 degrees Celsius lower. The density for nitrogen is taken as 0.89 g/l. The physical depth of the fixture limited the length of the flow to 10 mm, which is considered the characteristic distance for calculation of the Reynolds number.

The Reynolds number is given by the formula:

$$R = \rho VD/\mu$$

Where $\rho$ is the density in g/l, V the flow velocity, D is the characteristic distance in m and $\mu$ is the viscosity in Poise (Pa s).

The flow velocity through the fixture is obtained by computing the volume of the flow area between the inner and outer cylinder of the fixture (subtracting the volume of the inner cylinder from the outer cylinder), computing the residence time in the volume for the aforementioned flows, and dividing the length of the flow distance by the residence time.

For a 1 mm flow channel between the inner and outer channel the volume is 0.00102 l, resulting in a residence time of 0.0102 s (0.1 l/s flow) and a flow velocity of 0.98 m/s.

$$R = 0.89 \text{ g/l}(0.98 \text{ m/s})0.010 \text{ m}/0.000018 = 484$$

For a 2 mm flow channel between the inner and outer channel the volume is 0.0038 l, resulting in a residence time of 0.038 s (0.1 l/s flow) and a flow velocity of 0.26 m/s.

$$R = 0.89 \text{ g/l}(0.26 \text{ m/s})0.010 \text{ m}/0.000018 = 128$$

The choice of a 2 mm distance was taken to allow for a lower Reynolds numbers even at higher flows.

The nozzle spacing in the fixture was calculated through a series of flow simulations using finite element analysis to optimize nozzle spacing in relation to fixture dimensions. The fixture configuration was verified by conducting a series of experimental tests using smoke to visualize the flow pattern and then obtaining the same results on the edge of the DVD adhesive as with a purged system.

Another exemplary approach of the subject matter herein pertains to the laminar flow curing of inks and related polymeric formulations used in the graphics industry. In a number of offset, flexo, screenprint and stamping applications the reaction rate can be enhanced by creating a laminar flow of reagents at the surface of the ink. FIGS. 3, and 8-10 illustrate a system 10 and systems assemblies and components suitable for use in ink curing with an optional laminar flow of inerting agent 23. An inerting fixture 22 is assembled below light source 12. The fixture has a first side 24 that runs generally adjacent and parallel to an upstream edge of the exposure window or windows of light source 12. The upstream edge is where the target material 1 is first moved into the exposure zone of the light source. In this example, the target material is fed from an upstream roller 50*a* to another roller 50*b* on the downstream side of system 10. The material is fed through the system after an ink jet unit (not shown) applies a UV curable ink to material on roller 50*a*.

A second side 26 is on an opposite side of the exposure window(s). A space or opening 32 separates the sides 24 and 26 and provides a channel for light from light source 12 to pass through to target object 1. The separation also defined the area of laminar flow over the target object. The fixture has inlets 34*a-b*, 36*a-b* that are fluidically coupled to a source for the inerting agent, such as a reservoir of nitrogen or a nitrogen generation system and respectively to apertures 28 and 30. Controlling the flow from the inlets determines direction, volume, and speed of flow. Optionally, one set of apertures could be coupled to a low pressure source to help pull fluid from opposite apertures at higher pressure.

Each side 24 and 26 includes a plurality spaced flow apertures 28 or 30, such as openings in a surface of side 24 or 26 or projecting nozzles from such a surface. The flow apertures 28 on side 24 introduce the inerting agent (or other fluid agent) to the target object positioned below. As illustrated in FIG. 8B, the apertures 28 (or 30) may be configured with an angle to direct the flow of inerting agent non-perpendicularly onto the surface of the target object 1 and towards apertures 30 (or 28), and thereby promote laminar flow. The opposing plurality of apertures 30 in side 26, are at a negative pressure relative to those in side 24, and therefore draw the inerting agent across the target object surface and uptake it. The direction of laminar flow may be alternated by introducing the high pressure fluid from aperture 30 instead of aperture 28. The spacing of the sides, the flow apertures on a given side, inlet and outlet pressures, and other conditions (described herein and in PCT/US2005/047605 (WO 2006/072071), are regulated to create a desired laminar flow across the target object surface. In the case of curing, this allows displacement from the surface of the oxygen in the ambient air, and therefore eliminates or reduces oxygen inhibition. In the typical curing operations, the polymerization of ink is performed on a web passing underneath the fixture in one direction or in a bidirectional mode. In the bidirectional mode the light source is moving across the target object in passes from one side to the other. The flow is redirected to accommodate the direction of the movement of the light source, this creating the laminar flow under the emission area of the source. In one case, the flow apertures 28 on the upstream side of the fixture are used to create the laminar flow between the target object and the light source for one direction, and flow apertures 30 are used for the other direction. The distance between the laminar flow fixture and the target object will define the amount of gas consumption and the flow conditions necessary to preserve laminar flow at the boundary layer (Zone A).

In one possible embodiment, the laminar flow fixture is enabled to provide an adjustable length flow. This can be achieved, for example, by creating a plurality of groups of flow apertures wherein one group is individually controllable from another group. By creating lengthwise groups, the width of the flow is adjustable to match the width of the printing material or any other substrate or material under photo-reaction.

In the application for the table mounted polymerization the laminar flow conditions resulting in full cure of UV inks on a poster board (target object) are defined by the distance between the light source and the poster board, the length of the light source and the velocity of the light source in respect to the poster board. At a distance of 2 mm, a length of 300 mm and a velocity of 0.25 m/s, the flow rate to fill the scanned volume between the source and the poster board is 9 l/min. In order to achieve the purest reagent layer at the boundary layer Zone A, a Reynolds number below 1000 must be maintained. In the case of nitrogen inerting under standard atmospheric pressure and temperatures from 25 to 125 degrees Celsius density for nitrogen is taken as 0.89 g/l. The physical distance that is curing the material is 10 mm, this is taken to be the characteristic distance for calculation of the Reynolds number.

The flow velocity as calculated above is 0.25 m/s or faster, $R$=0.89 g/l(0.25 m/s)0.010 m/0.0000166=134

For a 2 mm distance between the light source and the posterboard, the flow need for a velocity of 0.5 m/s is 18 l/min. At 20 l/min flow the resulting flow velocity through the area between the source and posterboard is 0.55 m/s.

$R$=0.89 g/l(0.55 m/s)0.010 m/0.0000166=294

It is clear that the optimum conditions for the laminar flow reagent are dependent on the velocities of the gantry. The optimum concentrations of reagent for the specific control of the reactions in the boundary layer Zone A are more efficiently attained through laminar flow conditions.

$R$=0.89 g/l(2.22 m/s)0.010 m/0.0000166=1190

The fixture configuration was verified by conducting a series of experimental tests using inks to verify the curing speed obtained with the laminar flow. This allows the system to be applied to gantry inkjet systems as well as flexographic/lithographic roll-to-roll processes or presses. The fixture used in the test was similar to that shown in FIGS. 8-10 and described above. It was about 26" long on each side, about ½", wide and about 0.43" thick. Flow apertures are generally spaced along the outer ½" portion of the width of each side. A manifold for distributing pressure is spaced along the adjacent inner side. The flow apertures have a diameter of about 2 mm and are spaced at about 4 mm center-to-center. There are two staggered two of apertures on each side rows of apertures on each. The row spacing is about 4 mm.

In both cases, relative to flood inerting, the laminar flow fixtures allow for lower consumption of reagent gas (nitrogen) by producing the desired laminar flow across the surface of the Zone A.

Figure 12:
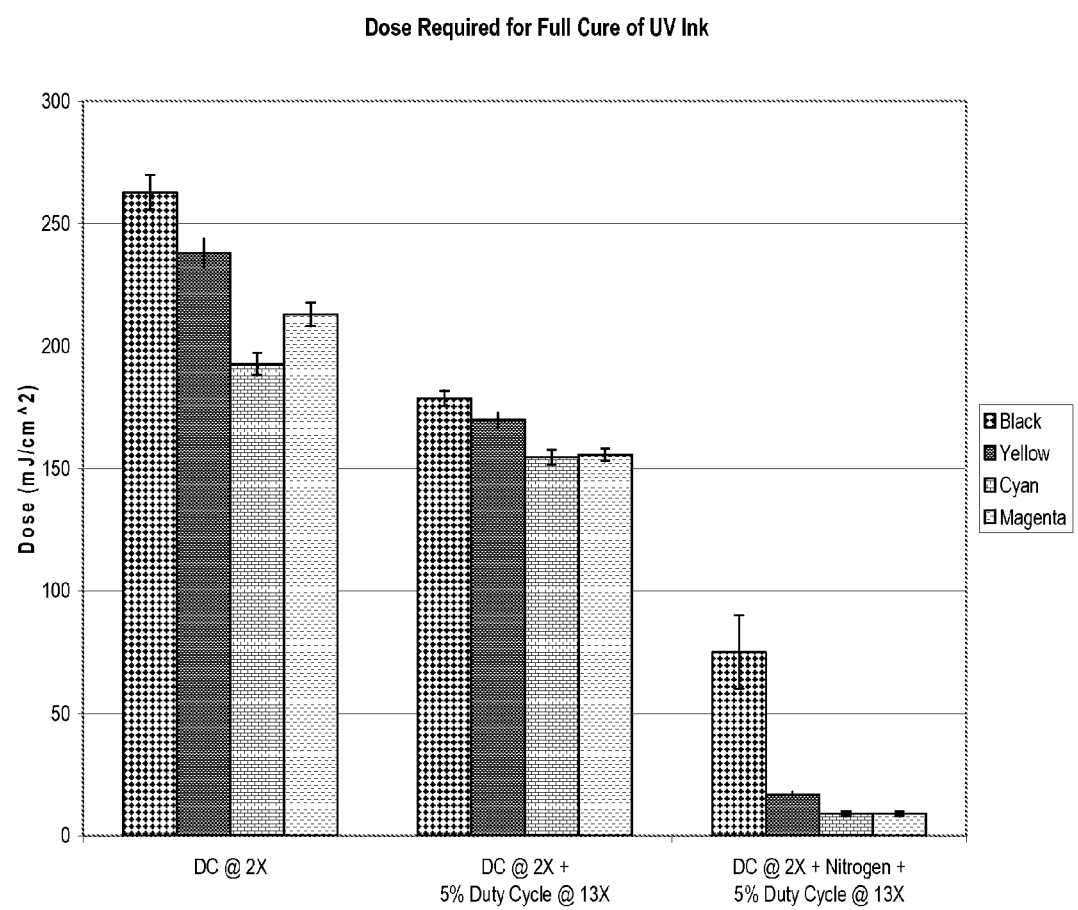
FIG. 12 is a graph showing dose (power outputs) for curing certain inks under different conditions, some of which are according to the inventive subject matter.
Figure 13:
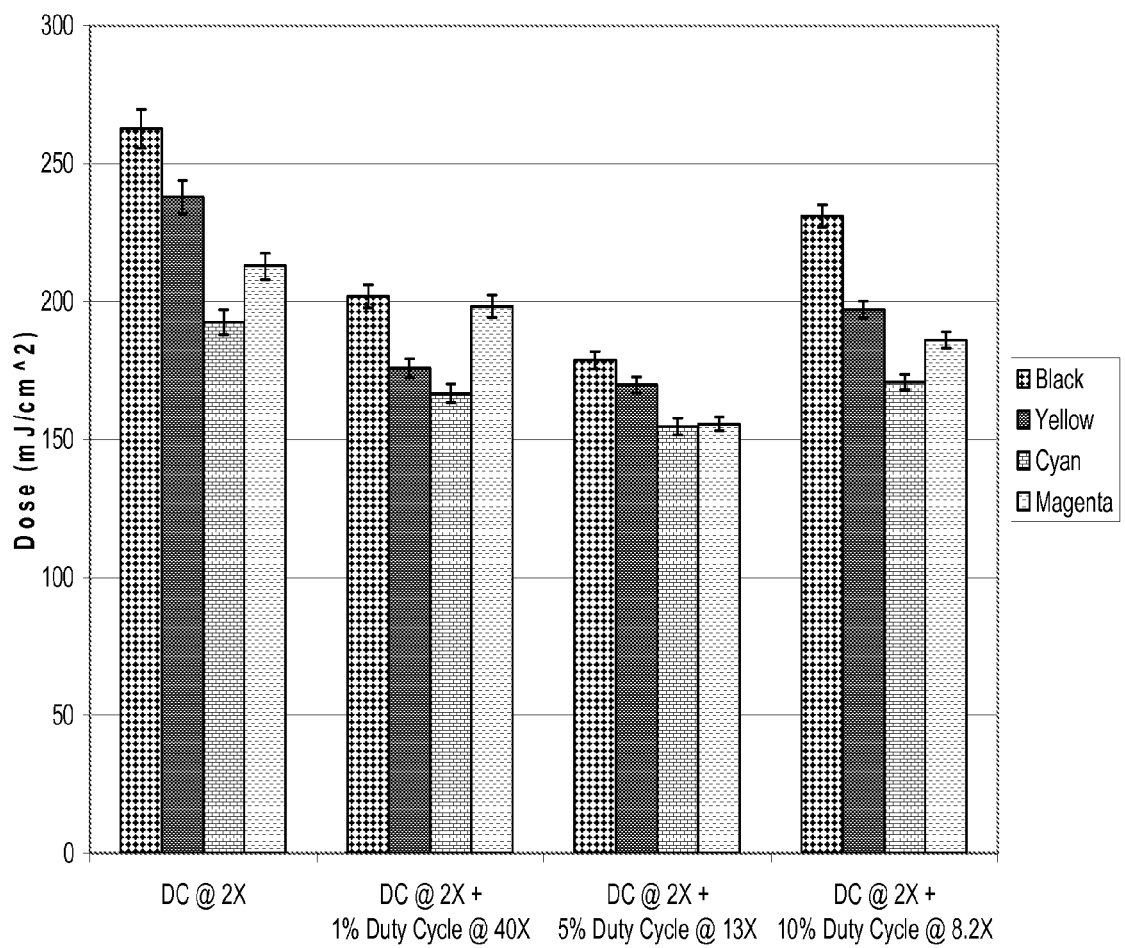
FIG. 13 is a graph showing dose (power outputs) for curing certain inks under different conditions, some of which are according to the inventive subject matter.

Looking now at FIG. 12, a study was undertaken to assess the minimum amount of energy (dose) required to achieve a "full cure" where a 13 µm thick layer of UV curable ink has good adhesion to a 10 mil styrene (substrate material), and the zone in contact with the inhibitor has achieved good polymerization, which can be observed by inspecting the surface for material transfer. The study compared continuous power output profile with several super-pulsing profiles. Groups of black, yellow, cyan and 10 magenta UV curable inks were separately tested. And the dose for the curing of each group of each is shown in the graph of FIG. 12. All tests were performed at ambient conditions (no inerting). Ambient with "DC only" represents the RX STARFIRE™ lighting source run at a continuous (DC) output level of 1 W/cm$_2$. The super-pulsing was based on the indicated duty cycles (square wave form) at the indicated multiple of the rated power for the emitters in the RX STARFIRE™ array. The emitted wavelength was from between 380 and 420 nm for all tests. The super-pulsing was superimposed over a base power of 1 W/cm$_2$ (2X nominal). As can be seen, all cases of superpulsing resulted in lower doses for full cure compared with the performed better than the continuous output for all colors. FIG. 13 shows that a 5% duty cycle at a 20 frequency of 200 Hz with a peak irradiance of 4 W/cm$_2$ reduced the total energy required to achieve a full cure by 30% for the black ink.

Looking now at Fig 13, a study was undertaken to assess the minimum amount of energy (dose) required to achieve a "full cure" where a 13 µm thick layer of UV curable ink has good adhesion to a 10 mil styrene (substrate material), and the zone in contact with the inhibitor has achieved good polymerization, which can be observed by inspecting the surface for material transfer. The study compared (1) continuous power output profile under ambient conditions, (1) super-pulsing profiles under ambient, and (3) super-pulsing under inert conditions. Groups of black, yellow, cyan and magenta UV curable inks were separately tested. And the dose for the curing of each group of each is shown in the graph of FIG. 12. Ambient with "DC only" represents the RX STARFIRE™ lighting source run at a continuous (DC) output level of 1 W/cm$_2$. The super-pulsing was based on the indicated duty cycles (square wave form) at the indicated multiple of the rated power for the emitters in the RX STARFIRE™ array.

The super-pulsing under nitrogen, shown on the far right, was based on hypothetical data. Subsequent actual tests for black ink showed a frill cure at even lower power levels (12 mJ/cm$_2$) than indicated in the hypothetical.

The emitted wavelength was from between 380 and 420 nm for all tests. The super-pulsing was based on a 5% duty cycle (square wave form) at 13× rated power. The super-pulsing was superimposed over a base power of 1 W/cm$^2$. The inerting was by laminar flow of nitrogen gas over the surface of the inks and substrate. The 5% super-pulsing at 13× rated power, with inerting, performed best of all, and a full cure took only a fraction of the energy used when super-pulsing in ambient conditions, which in FIG. 12 was already shown to be less than that of the continuous profile under ambient conditions.

One significant advantage of the inventive subject matter is the ability to run the solid-state emitters higher than their rated output without negatively affecting the manufacturer's rated lifetime or output power. For example, if the emitters were run in a DC operation mode at levels required to achieve a good cure in Zone A and in Zone B, the expected lifetime would be less than about 50 hours. While operating these same emitters at the aforementioned pulsing there have been less than a 10% drop in power output over 1000 hours of operation.

If a cooled array of emitters, such as are available from Cree, Inc. of Durham, N.C., and disclosed in PCT Patent Application PCT/US03/14625, incorporated by reference above, or disclosed in U.S. Pat. No. 7,071,493, which is under common ownership with this patent document, are operated at their nominal current rating, an irradiance of 0.3 W/cm$^2$ has been seen. This power level is insufficient to achieve a good cure in Zone A (in contact with the inhibitor) of a typical target object of a curable UV ink on a printing substrate. To achieve a good cure in Zone A, the inventive subject matter contemplates pulsing the emitters to at least 10× their nominal rating achieving a peak irradiance level of 4 W/cm$^2$, and emitter service life remains comparable to the lifetime of the nominal power rating, namely 1000 hrs of service.

Exemplary Light Sources

Exemplary solid-state light sources which may be used in the foregoing concepts include those set forth in PCT Patent Application PCT/US03/14625, incorporated by reference above. PCT Patent Application PCT/US03/14625 discloses, among other things, high-intensity light sources that are formed by a micro array of semiconductor light sources, such as LEDs, laser diodes, or VCSEL placed densely on a substrate to achieve power density output of at least 50 mW/cm$^2$. The disclosed semiconductor devices are typically attached by a joining process to electrically conductive patterns on the substrate, and driven by a microprocessor-controlled power supply. An optic element may be placed over the micro array to achieve improved directionality, intensity, and/or spectral purity of the output beam. The light module may be used for such processes as, for example, fluorescence, inspection and measurement, photo-polymerization, ionization, sterilization, debris removal, and other photochemical processes. Accordingly, the inventive concepts described herein contemplate a light source that provides channels for a set of attributes for any one or more of these processes. For example, a sterilization of a material could be conducted simultaneously with the curing of the material, which might provide new efficiencies or safety in manufacturing and medical applications.

Additionally, light sources that could be used could optionally include features disclosed by PCT Patent Application PCT/US2004/036370, filed Nov. 1, 2004, entitled "Use of Potting Gels for Fabricating Microoptic Arrays," invented by Duwayne R. Anderson et al., which is hereby incorporated by reference. PCT/US2004/036370 discloses, among other things, a lens array for collecting light from a light source such that the lens array is made of a curable gel that remains pliant after curing. The disclosed lens array may be used alone and without a hard epoxy matrix overcoat. The lens array may be used in a solid-state light emitting device array that includes a glass window that covers the solid-state light emitting device and the lens array so that the lens array cannot be physically interfered with or touched directly. An array of collecting microoptical lenses and/or prisms may be molded into the gel, and the gel lens used as an inexpensive array of lighting devices for the purpose of collecting and condensing the light from the solid-state light emitting device array so that it is less dispersive.

Further, light sources that could be used could optionally include features disclosed by PCT Patent Application PCT/US2004/036260, filed Oct. 28, 2004, entitled "Collection Optics For LED Array With Offset Hemispherical or Faceted Surfaces," invented by Duwayne R. Anderson et al. which is hereby incorporated by reference. PCT Patent Application PCT/US2004/036260 discloses, among other things, an array of LEDs having a lens array for collecting divergent light from each LED. Each lens in the array is associated with a respective LED and has a compound shape including a curved surface that may be spherical or may have an offset aspherical shape. The curved surfaces are centered about each side of its associated LED. The lens may alternatively include faceted surfaces that approximate the curved lens surface.

Further still, light sources that could be used could optionally include features disclosed by U.S. Non-provisional patent application Ser. No. 11/083,525, filed Mar. 18, 2005, entitled "Direct Cooling of LEDs," invented by Mark D. Owen et al. which is hereby incorporated by reference. U.S. Non-provisional patent application Ser. No. 11/083,525 discloses, among other things, a thermal management system for semiconductor devices, such as an LED array, that applies a coolant directly to the LED array. In one exemplary embodiment, the coolant is an optically transparent cooling fluid that flows across the LED array and circulates through a system to remove heat generated by the LED array.

Even further, light sources that could be used could optionally include features disclosed by U.S. Non-provisional patent application Ser. No. 11/084,466, filed Mar. 18, 2005, entitled "Micro-reflectors on a Substrate for High-Density LED Array," invented by Mark D. Owen et al. which is hereby incorporated by reference. U.S. Non-provisional patent application Ser. No. 11/084,466 discloses, among other things, an optical array module that includes a plurality of semiconductor devices mounted on a thermal substrate formed with a plurality of openings that function as micro-reflectors, such that each micro-reflector includes a layer of reflective and conductive material to reflect light and to electrically power its associated semiconductor device.

Additionally, light sources that could be used could optionally include features disclosed by U.S. Non-provisional patent application Ser. No. 11/104,954, filed Apr. 12, 2005, entitled "High Density LED Array," invented by Duwayne R. Anderson et al. which is hereby incorporated by reference. U.S. Non-provisional patent application Ser. No. 11/104,954 discloses, among other things, a dense array of semiconductor devices having an array of micro-reflectors, such that the micro-reflectors have characteristics that enhance dense packing of the array in balance with collection and collimation of the array's radiant output.

Also of potential relevance to the inventive concepts hereof is the subject matter of U.S. Provisional Patent Application Ser. No. 60/638,577, filed Dec. 22, 2004, entitled "Light Catalyzed Polymerization for Low Transmittance Materials and Different Chemical Environments," which is hereby incorporated by reference.

All patent and non-patent literature cited above is hereby incorporated by reference as if listed in its entirety for all purposes.

The invention claimed is:

1. A system for performing curing of target object, comprising:
   a light source comprising an array of solid state light devices configured for providing onto the target object a (i) first channel of light output comprising a substantially continuous pulse of light emission, and (ii) a second channel of light output comprising a pulsed light emission, both channels being within a wavelength range sufficient to caused desired curing in the target object, and wherein the second channel pulsed emission of light at a peak irradiance is in the range of about 2 to about 100 times greater than that of the irradiance of the continuous emission and both channels operate simultaneously; and
   the target object having at least two zones, each zone being curable by a different level of radiant output.

2. The system of claim 1 wherein the light source is enabled for a pulsed emission duty cycle of from about 1% to about 25% at about 0.02 Hz to about 40,000 Hz.

3. The system of claim 1 wherein the light source is enabled for a pulsed emission duty cycle of from about 1% to about 10% at about 0.02 Hz to about 40,000 Hz.

4. The system of claim 1 further comprising a laminar flow device for introducing laminar flow across a surface of the curable material of the target object that is exposed to the light emission from the light source.

5. The system of claim 1 further comprising a source of an inerting agent deliverable over the surface area by a laminar flow.

6. A method comprising:
   providing a laminar flow of a fluid over at least one surface zone of a target object;
   exposing the target object to a light that fosters a reaction in association with the at least one surface zone of the target object such that the fluid affects the reaction; and
   wherein the light comprises light from a solid state light source, the light source outputting to the target object a light profile comprising a continuous mode of output and a super-imposed pulsed mode.

7. The method of claim 6 wherein the output is provided by groups of emitters comprising a first group of one or more emitters dedicated to the continuous output and a second group of emitters dedicated to providing the pulsed output.

8. The method of claim 6 wherein the output is provided by a group of emitters dedicated to providing both the continuous and pulsed outputs.

9. A product comprising a photo-reacted target object, the target object being formed by a method comprising:
   providing a laminar flow of a fluid over at least one surface zone of a target object;
   exposing the target object to a light that fosters a reaction in association with at least one surface zone of the target object such that the fluid affects the reaction; and
   wherein the light comprises light from a solid state light source, the light source outputting to the target object a light profile comprising a continuous mode of output and a super-imposed pulsed mode.

* * * * *